United States Patent
Xu et al.

(10) Patent No.: US 7,064,565 B1
(45) Date of Patent: Jun. 20, 2006

(54) METHODS AND SYSTEMS FOR DETERMINING AN ELECTRICAL PROPERTY OF AN INSULATING FILM

(75) Inventors: Zhiwei Xu, Sunnyvale, CA (US); Thomas G. Miller, Sunnyvale, CA (US); Jianou Shi, Milpitas, CA (US); Gregory S. Horner, Santa Clara, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 0 days.

(21) Appl. No.: 10/699,352

(22) Filed: Oct. 31, 2003

Related U.S. Application Data

(60) Provisional application No. 60/422,735, filed on Oct. 31, 2002.

(51) Int. Cl.
*G01R 31/302* (2006.01)
*G01R 31/26* (2006.01)

(52) U.S. Cl. ..................................... 324/750; 324/765
(58) Field of Classification Search ................ 324/750, 324/765–767, 158.1, 754; 702/64, 65; 438/14, 438/17, 18; 250/492.2
See application file for complete search history.

(56) References Cited

U.S. PATENT DOCUMENTS

| | | | |
|---|---|---|---|
| 3,495,269 A | 2/1970 | Mutschler et al. |
| 3,496,352 A | 2/1970 | Jugle |
| 4,599,558 A | 7/1986 | Castellano et al. |
| 4,734,721 A | 3/1988 | Boyer et al. |
| 4,812,756 A | 3/1989 | Curtis et al. |
| 5,485,091 A | 1/1996 | Verkuil |
| 5,594,247 A | 1/1997 | Verkuil et al. |
| 5,644,223 A | 7/1997 | Verkuil |
| 5,650,731 A | 7/1997 | Fung |
| 5,661,408 A | 8/1997 | Kamieniecki et al. |
| 5,742,658 A | 4/1998 | Tiffin et al. |
| 5,767,693 A | 6/1998 | Verkuil |

(Continued)

FOREIGN PATENT DOCUMENTS

WO 98/57358 12/1998

OTHER PUBLICATIONS

Cosway et al., "Manufacturing Implementation of Corona Oxide Silicon (COS) Systems for Diffusion Furnace Contamination Monitoring," 1997 IEEE/SEMI Advanced Semiconductor Manufacturing Conference, pp. 98-102.

(Continued)

*Primary Examiner*—Jermele Hollington
(74) *Attorney, Agent, or Firm*—Ann Marie Mewherter; Daffer McDaniel, LLP

(57) ABSTRACT

Methods for determining a surface voltage of an insulating film are provided. One method includes depositing a charge on an upper surface of the insulating film and measuring a current to the wafer during deposition. The method also includes determining the surface voltage of the insulating film from the current. In this manner, the surface voltage is not measured, but is determined from a measured current. Another embodiment may include measuring a second current to the wafer during a high current mode deposition of a charge on the film and determining a second surface voltage of the film from the second current. This method may be repeated until a Q-V sweep is measured. An additional embodiment may include altering a control voltage during deposition of the charge such that a current to the wafer is substantially constant over time and determining charge vs. voltage data for the insulating film.

18 Claims, 3 Drawing Sheets

U.S. PATENT DOCUMENTS

| | | | |
|---|---|---|---|
| 5,773,989 | A | 6/1998 | Edelman et al. |
| 5,834,941 | A | 11/1998 | Verkuil |
| 5,852,232 | A | 12/1998 | Samsavar et al. |
| 5,866,806 | A | 2/1999 | Samsavar et al. |
| 5,948,485 | A * | 9/1999 | Amano et al. .............. 427/571 |
| 5,948,972 | A | 9/1999 | Samsavar et al. |
| 5,955,661 | A | 9/1999 | Samsavar et al. |
| 6,011,404 | A | 1/2000 | Ma et al. |
| 6,060,709 | A | 5/2000 | Verkuil et al. |
| 6,072,320 | A | 6/2000 | Verkuil |
| 6,091,257 | A | 7/2000 | Verkuil et al. |
| 6,097,196 | A | 8/2000 | Verkuil et al. |
| 6,104,206 | A | 8/2000 | Verkuil |
| 6,121,783 | A | 9/2000 | Horner et al. |
| 6,191,605 | B1 | 2/2001 | Miller et al. |
| 6,201,999 | B1 | 3/2001 | Jevtic |
| 6,202,029 | B1 | 3/2001 | Verkuil et al. |
| 6,224,638 | B1 | 5/2001 | Jevtic et al. |
| 6,267,005 | B1 | 7/2001 | Samsavar et al. |
| 6,569,691 | B1 | 5/2003 | Jastrzebski et al. |
| 6,734,696 | B1 * | 5/2004 | Horner et al. .............. 324/765 |
| 6,803,241 | B1 * | 10/2004 | Eom et al. .................... 438/14 |
| 2002/0090746 | A1 | 7/2002 | Xu et al. |

OTHER PUBLICATIONS

Miller, "A New Approach for Measuring Oxide Thickness," Semiconductor International, Jul. 1995, pp. 147-148.

*Numerical Recipies in C, The Art of Scientific Computing,* 2nd Ed., © Cambridge University Press 1988, 1992. p. 683.

Weinberg, "Tunneling of Electrons from Si into Thermally Grown $SiO_2$," Solid-State Electronics, 1977, vol. 20, pp. 11-18.

Verkuil, "Rapid Contactless Method for Measuring Fixed Oxide Charge Associated with Silicon Processing," IBM Technical Disclosure Bulletin, vol. 24, No. 6, 1981, pp. 3048-3053.

"Contactless Photovoltage vs. Bias Method for Determining Flat-Band Voltage," IBM Technical Disclosure Bulletin, vol. 32, vol. 9A, 1990, pp. 14-17.

"Contactless Electrical Equivalent Oxide Thickness Measurement," IBM Technical Disclosure Bulletin, vol. 29, No. 10, 1987, pp. 4622-4623.

* cited by examiner

METHODS AND SYSTEMS FOR DETERMINING AN ELECTRICAL PROPERTY OF AN INSULATING FILM

PRIORITY CLAIM

This application claims priority to U.S. Provisional Application No. 60/422,735 entitled "Methods and Systems for Determining an Electrical Property of an Insulating Film," filed Oct. 31, 2002.

BACKGROUND OF THE INVENTION

1. Field of the Invention

This invention generally relates to determining one or more electrical properties of an insulating film. Certain embodiments relate to determining one or more electrical properties of an insulating film without forming a semiconductor device structure and without contacting the insulating film.

2. Description of the Related Art

Fabricating semiconductor devices such as logic and memory devices may typically include processing a substrate such as a semiconductor wafer using a number of semiconductor fabrication processes to form various features and multiple levels of the semiconductor devices. For example, insulating (or dielectric) films may be formed on multiple levels of a substrate using deposition processes such as chemical vapor deposition ("CVD"), physical vapor deposition ("PVD"), and atomic layer deposition ("ALD"). In addition, insulating films may be formed on multiple levels of a substrate using a thermal growth process. For example, a layer of silicon dioxide may be thermally grown on a substrate by heating the substrate to a temperature of greater than about 700° C. in an oxidizing ambient such as $O_2$ or $H_2O$. Such insulating films may electrically isolate conductive structures of a semiconductor device formed on the substrate.

Measuring and controlling such insulating films may be an important aspect of semiconductor device manufacturing. A number of techniques are presently available for making such measurements. For example, the physical thickness of such films may be measured with a profilometer or an atomic force microscope ("AFM"). Such techniques typically involve scanning a probe across a surface of the film on which a step is present. A measurement of the step height may be used to determine a thickness of the film. Such measurements may be disadvantageous because they require the presence of a step in the film and are contacting in nature.

Electron microscopy techniques may also be used to determine a thickness of films such an insulating films. These techniques include, for example, transmission electron microscopy ("TEM") and scanning electron microscopy ("SEM"). These techniques are generally destructive and are relatively expensive due to the ultra high vacuum equipment required for such techniques.

Optical techniques may frequently be used to determine optical parameters of insulating films. In such methods, incident light and reflected light may be measured as a function of incident angle, wavelength, polarization, and/or intensity. Using models related to the propagation of light through transparent materials, the optical thickness of such films may be determined. In addition, other optical parameters such as optical index of refraction, optical extinction coefficient, and reflectivity may be obtained. Such measurements may have the disadvantage of providing only optical information, which may not be perfectly related to electrical parameters of electrical devices built using these films. Furthermore, such optical methods may only be used to measure substantially transparent materials.

Electrical measurement techniques that rely on physical contact to a conductive electrode on top of an insulating film may be used to determine relevant electrical properties of insulating films using capacitance vs. voltage ("C-V") and current vs. voltage ("I-V") measurements. Such measurements have a long history and established utility. These measurements, however, may require a conductive electrode and a contacting probe. The necessity of direct physical electrical contact is particularly undesirable in many manufacturing situations.

Non-contacting electrical test techniques have been developed to provide electrical capacitance, electrical thickness, and electrical conductivity information about insulating films. Non-contacting electrical measurements of dielectric properties have a unique advantage of providing electrically derived information without the requirement of physical contact to an electrode on top of an insulating film. These techniques typically use an ion generation source such as a corona discharge system to deposit a corona charge ($Q_c$) and a non-contacting voltage measurement sensor such as a Kelvin Probe or a Monroe Probe to measure surface voltage ($V_s$) or surface photo-voltage (SPV). By repeatedly depositing a corona charge and measuring $V_s$ or SPV, $V_s$ vs. $Q_c$ and SPV vs. $Q_c$ data can be obtained. Examples of such techniques are illustrated in U.S. Pat. No. 5,485,091 to Verkuil, U.S. Pat. No. 6,097,196 to Verkuil et al., and U.S. Pat. No. 6,202,029 to Verkuil et al., which are incorporated by reference as if fully set forth herein.

There are, however, several disadvantages associated with such non-contacting techniques. For example, these techniques can have a relatively low throughput because a wafer must be moved back and forth between a corona source and a measurement probe. Measurements obtained with these techniques may also be sensitive to film leakage because corona deposition and measurement are not performed at the same time. In addition, accurate time control is difficult. Therefore, the accuracy of the measurement is affected, and the measurement sensitivity is limited. In addition direct measurement of film leakage is difficult because measurement can start only after charge is deposited, and the wafer is moved underneath the measurement probe. Furthermore, the measurements are sensitive to Kelvin probe and Monroe probe work function variation. Accordingly, it may be advantageous to develop a non-contacting technique that has a relatively high throughput and that provides measurements that are not sensitive to film leakage and work function variation in a probe.

SUMMARY OF THE INVENTION

An embodiment relates to a method for determining a surface voltage of an insulating film. The insulating film may be formed on a substrate, which may be commonly referred to as a "wafer." The method may include depositing a charge on an upper surface of the insulating film. In one embodiment, depositing a charge on the insulating film may include exposing the wafer to a plasma. The method may also include measuring a current to the wafer during deposition of the charge. In addition, the method may include determining a surface voltage of the insulating film from the current. For example, an accumulated voltage may be determined as a function of the current. The function may be determined by calibration of a charge deposition system used for deposition of the charge. The surface voltage may be determined from the accumulated voltage and a reference voltage of the deposition. In another example, the charge may be detected by a reference sensor during deposition of the charge on the insulating film. A bias voltage of the reference sensor may be measured. The surface voltage of the insulating film may be approximately equal to the bias voltage of the reference sensor when the current to the reference sensor is approximately equal to the current to the wafer. Therefore, in both examples, the surface voltage of the insulating film is not measured, but is determined from a measured current to the wafer.

In one embodiment, the method may include illuminating the upper surface of insulating film while measuring the current to the wafer. This method may also include determining a band-bending voltage at an interface between the insulating film and the substrate as a difference between the surface voltage and a surface voltage of the insulating film determined without such illumination. In an additional embodiment, the method may include illuminating the upper surface of the insulating film with an alternating current (AC) modulated light source during deposition of the charge and measurement of the current. This method may also include determining a direct current (DC) component and an AC component of the current at the frequency of the light source. The surface voltage may be determined for the DC and AC components of the current.

In another embodiment, the charge may be deposited on the insulating film over time. In this embodiment, the method may include determining charge build up on the upper surface of the insulating film by integrating the current over the time. In a further embodiment, the method may include altering a control voltage after measuring the current. This method may also include repeating deposition of the charge and measuring the current after the control voltage has been altered such that a surface voltage of the insulating film can be determined for the altered control voltage.

In an additional embodiment, the method may include determining a parameter representing an electrical property of the insulating film from the surface voltage. In another embodiment, the method may include altering a parameter of a process tool in response to the electrical property using a feedback control technique. In a further embodiment, the method may include altering a parameter of a process tool in response to the electrical property using a feedforward control technique. In yet another embodiment, the method may be performed during a semiconductor fabrication process.

An additional embodiment relates to a method that includes measuring a first current to a wafer during deposition of a first charge on a surface of the wafer. The wafer may include an insulating film formed on a substrate. The method may also include determining a first surface voltage of the insulating film from the first current. In addition, the method may include measuring a second current to the wafer after a high current mode deposition of a second charge on the surface of the wafer. The method may further include determining a second surface voltage of the insulating film from the second current. The first and second surface voltages may be determined at approximately the same location on the insulating film.

In one embodiment, the method may include repeating measurement of the second current and determination of the second charge until a charge vs. voltage "Q-V" sweep is measured. In another embodiment, measurement of the first current may include measuring the first current while altering a control voltage. In this embodiment, a current turn-on point may be determined from the first current vs. the control voltage, and the first surface voltage may be determined from the value of the first current at the current turn-on point. In an additional embodiment, the first and second charges may be deposited with the same charge deposition system. In an alternative embodiment, the first and second charges may be deposited with different charge deposition systems. The method may include any additional steps as described herein.

Another embodiment relates to a method for determining charge vs. voltage data for an insulating film. The insulating film may be formed on a substrate. The method may include depositing a charge on an upper surface of the insulating film. The method may also include altering a control voltage during deposition of the charge such that a current to the wafer is substantially constant over time. In some embodiments, the control voltage may be a reference voltage of the charge deposition system or a reference voltage of the wafer. In addition, the method may include determining a voltage of the insulating film as a function of the charge deposited on the insulating film. The voltage may be determined from the control voltage and the current. The charge deposited on the insulating film may be determined from the current and the time. The method may include any additional steps as described herein.

BRIEF DESCRIPTION OF THE DRAWINGS

Other objects and advantages of the invention will become apparent upon reading the following detailed description and upon reference to the accompanying drawings in which.

Figure 1:
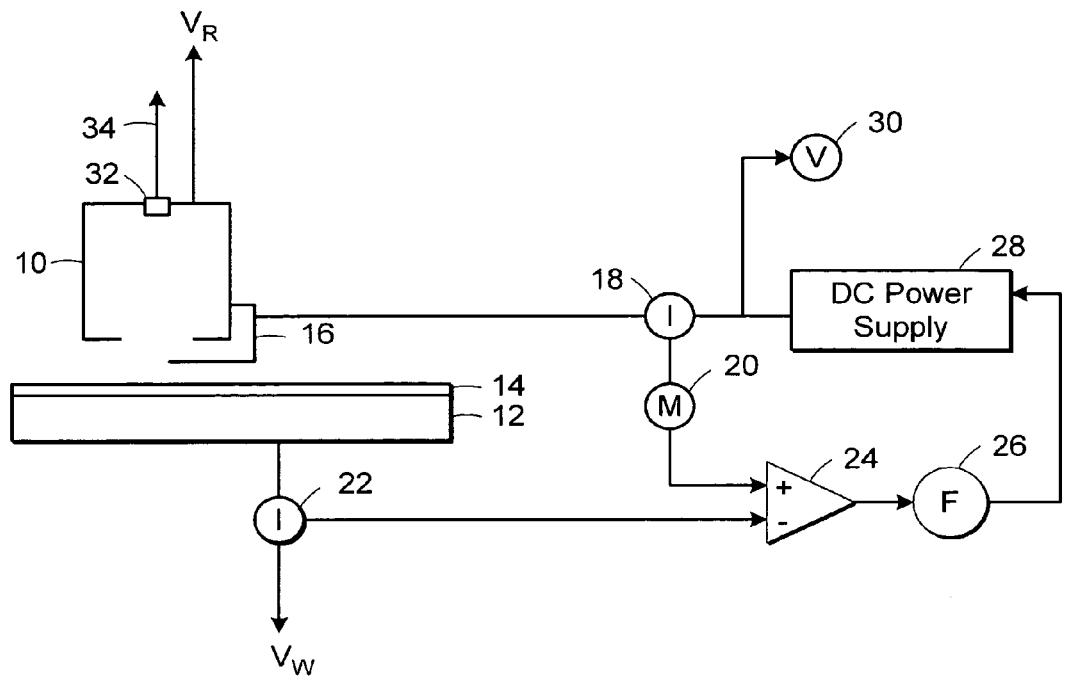
FIG. 1 illustrates a schematic diagram of an embodiment of a system that can be used to experimentally determine a surface voltage of an insulating film from a current.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

The following description generally relates to systems and methods for determining parameters representing electrical properties of insulating films. In particular, the following description relates to systems and methods for measuring insulating films using simultaneous charge deposition and indirect surface voltage measurement without forming a device structure and in a non-contact manner. The methods can be used to measure I-V, Q-V, and C-V characteristics of an insulating film. Such data can be used to calculate various parameters representative of electrical properties of an insulating film such as, but not limited to, electrical thickness, flatband voltage, interface trap density, charge, and threshold voltage. In a common implementation, the films in question may be produced in processes of semiconductor device manufacturing. In some embodiments, the methods may be used to measure insulating film in the presence of imperfect insulation.

Present technology for manufacturing integrated circuits and semiconductor devices makes extensive use of the formation of insulating films. These films may also be referred to as "dielectric layers." In a typical implementation, such an insulating film may include silicon dioxide ("$SiO_2$"), silicon nitride ("$Si_3N_4$"), or a nitrided form of amorphous $SiO_2$, which may be commonly referred to as oxynitride ("$SiO_xN_y$"). Many other materials are also commonly used. Frequently, such films may have relatively high insulating qualities. However, relatively thin films (i.e., films having a thickness of less than about 8 nm) may depart substantially from ideal insulating behavior. That is to say that such films may allow significant amounts of current to flow through the insulating film.

For insulating films that are not a form of $SiO_2$, significant departures from a perfect insulator may occur at substantially greater thickness such as thicknesses of greater than about 30 nm, or even greater than about 50 nm. Such less ideally insulating materials may include materials commonly known as "high-k" or "low-k" insulators, where "k" refers to the real part of the dielectric constant as measured at electrical frequencies. A high-k dielectric material may include any material having a dielectric constant of greater than about 3.9. Examples of high-k materials include, but are not limited to, tantalum pentoxide ("$Ta_2O_5$"), hafnium dioxide ("$HfO_2$"), aluminum trioxide ("$Al_2O_3$"), and zirconium dioxide ("$ZrO_2$"). A low-k dielectric material may include any material having a dielectric constant of less than about 3.9. Examples of low-k materials include, but are not limited to, proprietary materials known as Silc™, Black Diamond™, and Flare™. It is to be understood that the methodology described herein is not specific to any composition or thickness of insulating film being used.

Such insulating films may be formed, for example, by deposition or thermal growth on a conductive or semiconductor substrate. The substrate may include, but is not limited to, silicon, epitaxial silicon, silicon-on-insulator ("SOI"), or another semiconductor or conductive material such as gallium arsenide or indium phosphide. The substrate may also include any substrate commonly found and/or processed in semiconductor fabrication facilities, which may be commonly referred to as a "wafer." In other cases, the insulating film of interest may be the top layer of a stack of insulators, insulators and conductors, or conductors.

On-line process control and monitoring provides tremendous benefit to semiconductor fabrication and manufacturing because of its relatively short turn-around time and relative ease in data interpretation compared to device-based C-V techniques, which require complicated device fabrication. Traditionally, physical thickness of insulating films has been the single most important parameter in on-line (frontline) gate process control and monitoring because of the relatively good correlation between the physical thickness measurements and backend electrical testing results. Backend electrical testing is usually performed on MOS-based device structures.

Using physical thickness as a process control and monitoring parameter is, however, becoming increasingly difficult due to the scaling down of insulating film thicknesses to the sub-15 Å level. For example, as described above, film leakage on ultra-thin oxide is no longer negligible at such thicknesses. Therefore, film leakage may reduce the accuracy and sensitivity of corona-based non-contact electrical measurements of thickness. For example, such measurement techniques are sensitive to film leakage because corona deposition and measurement are not performed at the same time. In addition, accurate time control is difficult thereby reducing the measurement accuracy and sensitivity of these techniques. In addition, at such thicknesses, the film leakage has a non-negligible impact on device performance. Therefore, film leakage is becoming an increasingly important characteristic of insulating films as the thickness of such films is reduced. Measuring film leakage using corona-based non-contact electrical measurement techniques, however, is difficult because the measurement can start only after the charge is deposited and the wafer is moved underneath the measurement probe. In addition, traditional thickness measurement techniques such as ellipsometry do not provide information about film leakage. The methods described herein, however, provide more accurate measurements of insulating film properties and higher throughput than currently available techniques by incorporating simultaneous charge deposition and current to wafer measurements, which can be used to determine a voltage of the insulating film.

The methods described herein are performed with a charge deposition system. The charge deposition system may be a point corona source, a wire or "blanket" corona source, an e-beam or ion beam source, or a plasma system. In addition, the charge deposition system may be selected to have a substantially uniform charge over an area of deposition. The current to a wafer ($I_w$) from the charge deposition system can be described as a function of ($V_s-V_r$), $F(V_s-V_r)$, where $V_s$ is the voltage at the surface of the wafer, and $V_r$ is a reference voltage of the charge deposition system that can be controlled by an operator. The wafer may include an insulating film formed on a substrate. Therefore, when a semiconductor wafer is measured, $V_s$ is the voltage at an upper surface of the insulating film. In addition, $V_s$ can be defined as $V_s=V_{film}+V_{BB}+V_W\phi$, wherein $V_{film}$ is the voltage across the insulating film, $V_{BB}$ is the band-bending voltage at an interface between the insulating film and the semiconductor substrate, $V_w$ is the voltage of the wafer (substrate), and $\phi$ is a constant that is related to work function. For convenience purposes, $V_0$ is also defined as $V_0=V_{film}+V_{BB}$. For a corona deposition system, the accumulated voltage, V, can be defined as $V_s-V_r$. Therefore, $I_w$ can also be described as a function of V, F(V). F(V) is a well-defined function, which means that there is a one-to-one relationship between F and V within the voltage range of interest. In addition, the magnitude of F decreases with increasing V.

In one embodiment, F(V) can be determined by calibration of the charge deposition system. Calibration may be performed before or after measurement of an insulating film. Calibration of the charge deposition system may include depositing a charge on a calibration sensor with the charge deposition system. The calibration sensor may be placed at the exit of the charge deposition system either manually or automatically using, for example, an automated positioning system. In some embodiments, the calibration sensor may be placed on a chuck on which a wafer is placed during a measurement. The calibration sensor may have a metal surface having a known work function, $\phi_c$. During calibration, the current to the calibration sensor and $V_{sensor}$ may be measured, where $V_{sensor}$ is the bias voltage of the calibration sensor. $V_r$ may also be recorded during calibration. V may then be determined as $V=V_{sensor}-V_r+\phi_c$. Therefore, the current to the calibration sensor measured during calibration and the determined values of V can be used to generate F(V). In a similar manner, $I_w$ measured during calibration and values of V determined during calibration can be used to generate $F(V_s)$ for a constant value of $V_r$. $F(V_s)$, therefore, describes $I_w$ as a function of $V_s$ at the constant value of $V_r$. In this manner, the function can be used to determine $V_s$ for a value of $I_w$ recorded during measurement of an insulating film at the constant value of $V_r$.

The function can be used to determine V for a value of $I_w$ recorded during measurement of an insulating film. For example, a measured $I_w$ may be compared to current vs. voltage data generated by calibration to determine V corresponding to the measurement of the insulating film. Vs of the insulating film can determined from V and $V_r$, $V_s=V+V_r$, where $V_r$ is recorded during measurement of the insulating film. $V_w$ may also be recorded during measurement of the insulating film. From $V_s$ and $V_w$, $V_o$ can be determined as $V_0=V_s-V_w-\phi$.

In another embodiment, the wafer surface voltage, $V_s$, can be determined experimentally using a feedback control algorithm and an optional reference sensor. FIG. 1 illustrates a schematic diagram of a system that can be used to determine F(V) experimentally. Charge deposition system 10 is disposed above chuck 12. Wafer 14 is disposed upon chuck 12 during a measurement process. Reference sensor 16 may be coupled to an external surface of charge deposition system 10 by an insulating material. Reference sensor 16 may be placed proximate the exit of charge deposition system 10 such that the reference sensor can detect charge from the charge deposition system. In this manner, the reference sensor may be configured to detect charge from the charge deposition system in real time as the charge is being deposited on the insulating film during a measurement. The current to the reference sensor, $I_r$, is measured by current meter 18. Multiplier 20 is used to alter the $I_r$ signal to compensate for differences between the sensor size and the wafer size and differences between sensor placement and wafer placement. The current to wafer, $I_w$, is measured by current meter 22.

Wafer surface voltage, $V_s$, can be determined based on the fact that the current to the reference sensor, $I_r$, (after being altered by the multiplier) is approximately equal to the current to the wafer, $I_w$, when the wafer surface voltage, $V_s$, is approximately equal to the reference sensor voltage, $V_{sensor}$. Therefore, the $I_r$ signal and the $I_w$ signal are fed into comparator 24, which compares the $I_r$ and $I_w$ and generates a comparison signal. The comparison signal from comparator 24 is provided to feedback control circuit 26. Either comparator 24 or feedback control circuit 26 may be configured to covert the currents to voltages. Feedback control circuit 26 provides a control voltage signal to DC power supply 28, which is coupled to the reference sensor. The control voltage signal may be used to alter the power supply provided to the reference sensor by DC power supply 28. The bias voltage of the reference sensor, $V_{sensor}$, is measured by voltmeter 30. Therefore, $V_s$ can be set equal to $V_{sensor}$, when $I_w$ is approximately equal to $I_r$. $V_w$ is determined from $I_w$. For example, the $I_w$ signal may be fed to a current-to-voltage converter (not shown) and a voltmeter (not shown). In addition, $V_w$ may be altered by a DC power supply (not shown). Alternatively, $V_w$ may be connected to ground. In this manner, chuck 12 may provide a grounding contact to wafer 14. The grounding contact may be obtained, for example, from a high pressure contact using a sharp tungsten carbide needle. From $V_s$ and $V_w$, $V_o$ can be determined as $V_0=V_s-V_w-\phi$. This method can be used either in DC mode or in AC mode to determine the DC mode and AC mode in $V_s$ when a modulated $I_w$ is measured. Measuring a modulated $I_w$ may be performed as described herein.

The system and the charge deposition system illustrated in FIG. 1 may include a number of other components, which are not shown in FIG. 1. For example, the system may include a position actuator configured to move charge deposition system 10 over wafer 14. The system may also include a high voltage supply coupled to charge deposition system 10. The high voltage supply may be configured to supply high voltage (i.e., about 6 kV to about 12 kV) to the charge deposition system to produce positive or negative corona charges depending on the polarity of the supply. In addition, the charge deposition system may include one or more needles coupled to the high voltage supply. The charge deposition system may be configured to provide a well-defined and substantial beam charge density (to minimize measurement time) having relative uniformity (for measurement accuracy) across the selected site of interest on a wafer. For example, the system may also include a mask disposed between charge deposition system 10 and wafer 14. The mask may have an aperture that reduces the area of the wafer on which the charge in deposited. In this manner, the mask may increase the uniformity of the charge that is deposited on the wafer.

Figure 2:
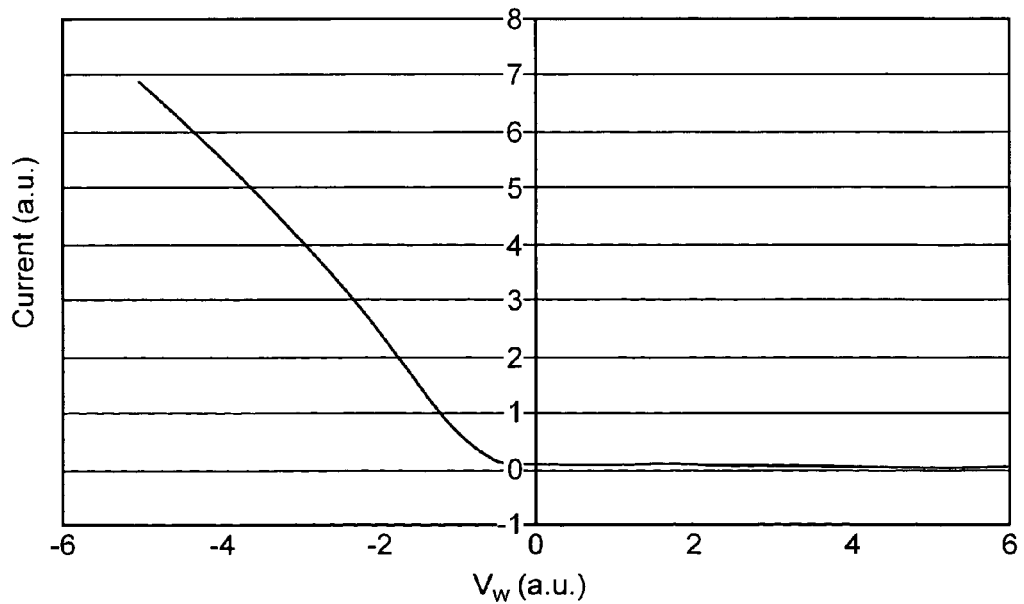
FIG. 2 is a plot of one example of representative current vs. voltage data that may be obtained by calibrating a screen corona gun.

In one embodiment, a screen corona gun may be used as the charge deposition system. Examples of screen corona guns are illustrated in U.S. Pat. No. 5,644,223 to Verkuil, U.S. Pat. No. 5,767,693 to Verkuil, and U.S. Pat. No. 6,060,709 to Verkuil et al., which are incorporated by reference as if fully set forth herein. A screen corona gun generally includes one or more needles that can be biased to relatively high voltages. Such a corona gun also includes focus and mask rings that increase the uniformity of the charge over the area of the deposition. In addition, a screen corona gun includes a screen proximate the corona charge exit that can be biased to various voltages. The current to a wafer, $I_w$, from a screen corona gun can be described as a function of the voltage difference between the wafer surface and the screen, $F(V_s-V_{screen})$. Therefore, in such a configuration, the screen voltage is equivalent to the reference voltage, $V_r$, described above. FIG. 2 is a plot of one example of representative current vs. voltage data that may be obtained by calibrating a screen corona gun. The data is representative of calibration of the screen corona gun using a metal plate and positive corona. As shown in FIG. 2, the current decreases to approximately 0 when $V_w>V_r+\phi$, where $V_r$ is the screen voltage and $\phi$ is a work function difference between the screen and the metal plate. Additional examples of non-contact corona sources are illustrated in U.S. Pat. No. 4,599,558 to Castellano et al. and U.S. Pat. No. 5,594,247 to Verkuil et al., which are incorporated by reference as if fully set forth herein. In addition, any other appropriate system and corona source known in the art may be used for carrying out a method as described herein.

In another embodiment, a plasma system may be used as the charge deposition system. Therefore, depositing a charge on the upper surface of the insulating film may include exposing the wafer to a plasma. The plasma system may include either a capacitance or inductive coupled plasma. In one example, the plasma system may include a plasma gun or another "point" plasma source such that electrons and ions may be deposited upon a controlled area of an insulating film. Such plasma systems are known in the art and are commercially available. When an insulating surface is placed underneath a plasma, an auto-biasing effect may occur because negative electrons can travel to the insulating surface more quickly than positive ions. When the insulating surface reaches a large enough negative potential, it has sufficient pushing effect on negative electron current and sufficient attracting effect on positive ion current to balance travel of the electrons and ions to the insulating surface. This saturation negative potential is mainly dependent on electron temperature in a plasma system. As described above, current to wafer, $I_w$, is determined by the difference between wafer surface voltage and a reference voltage. For such a plasma-based charge deposition system, the reference voltage is mainly related to electron temperature. The electron temperature can be controlled by parameters, which can be altered to control the plasma, such as gas pressure, gas species, radio frequency (RF) power that is used to excite and sustain the plasma, and RF source frequency. Thus, in such a configuration, the reference voltage, $V_r$, described above may vary depending upon the plasma controlling parameters.

The following describes what happens after a wafer with an insulating film or film stack is placed underneath a charge deposition system. The wafer may be placed underneath the charge deposition system either manually or automatically, for example, by using a robot sample loading system. For the sake of simplicity, it is assumed that the wafer is free of charge before it is placed into the system. As a result, the wafer surface voltage is about 0 V prior to deposition of a charge. After the charge deposition system is turned on with the appropriate control conditions, a charge is deposited on an upper surface of the insulating film to charge the wafer (either positively or negatively depending on the selection). In this example, the wafer is assumed to be positively charged. $I_w$ is measured over time during deposition of the charge. $V_s$ and $V_0$ may be determined from each measured $I_w$. As a result of deposition of a charge on the wafer surface, the wafer surface voltage, $V_s$, increases. The increasing wafer surface voltage results in decreasing current to wafer, $I_w$, until charge deposition (current to wafer) is balanced by the film leakage.

Figure 3:
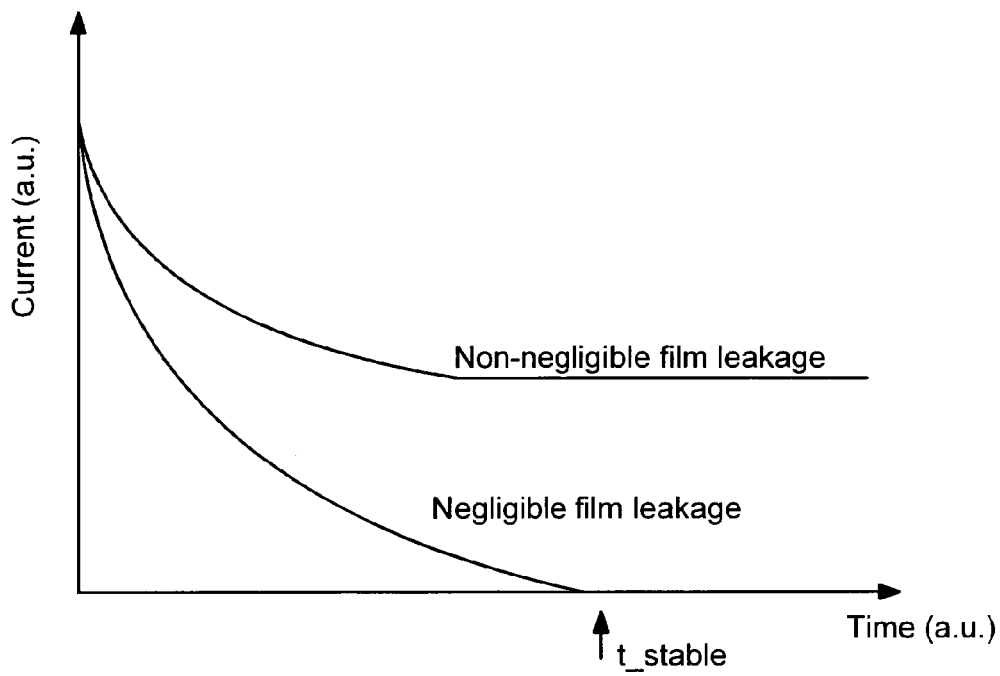
FIG. 3 is a plot of one example of representative current vs. time data for insulating films having negligible and non-negligible film leakage.

Deposition of the charge on the insulating film may continue until $I_w$ is substantially constant. Depending upon the leakage of the insulating film, $I_w$ will stabilize at various current levels. As shown in the plot of FIG. 3, for example, in the case of negligible film leakage, $I_w$ decreases until the insulating film has reached a saturation point. At this point, $I_w$ to the saturated insulating film is approximately 0. In contrast, in the case of non-negligible insulating film leakage, the current to the wafer, $I_w$, decreases over time until $I_w$ becomes substantially constant at a value greater than 0. The time at which $I_w$ is determined to be substantially constant has been labeled on the plot as $t_{stable}$. $t_{stable}$ may be determined as the time after which $I_w$ stabilizes within a tolerance that may be selected by an operator. In this manner, the insulating film leakage current can be determined as the substantially constant, or final saturated, $I_w$, which can be defined as $I_{w\_stable}(t \geq t_{stable})$, $I_{leak}(V_0) = I_{w\_stable}(t \geq t_{stable})$. $V_0$ at the insulating film leakage current can be determined using one of the methods as described above. The charge build up on the surface of the wafer, $Q_s(V_0)$, can also be determined by integrating $I_w$ over time using the following equation:

$$Q_s = \int_0^{t_{stable}} (I_w(t) - I_{leak}(V_s)) dt,$$

where $t_{stable}$ is the time when $I_w(t)$ stabilizes. In the case of no or negligible film leakage, this equation can be simplified as:

$$Q_s = \int_0^{t_{stable}} I_w(t) dt.$$

This measurement sequence can be repeated by measuring $I_w(t)$ at various reference voltages of the wafer, $V_w$, or at various reference voltages of the charge deposition system, $V_r$, to obtain $I_{leak}(V_0)$ and $Q_s(V_0)$ for a range of $V_0$. In addition, the measurement sequence can be performed at one measurement site or multiple measurement sites on the wafer.

In another embodiment, $I_{leak}$ may be determined experimentally as described above, with a theoretical model, or a combination thereof. Various theoretical models describing mechanisms for current transport through relatively thin insulating films have been developed and published. Examples of such models include, but are not limited to, Fowler-Nordheim tunneling, direct tunneling, an empirical model, Poole-Frenkel conduction, hopping conduction, space charge limited conduction, and Shottky or Thermionic conduction. Such theoretical models may have a general form of:

I=f(V, physical_$T_{film}$, other_material_parameters).

For example, the Fowler-Nordheim tunneling model has the following form:

$I = A_1(V/T_{film})^2 \exp(A_2 * T_{film}/V)$.

Other models of leakage have different functional dependencies. In general, all such models may be expressed in a functional form such as:

I=function($T_{film}$, V, $A_1$, $A_2$ ... $A_N$), where $A_1, A_2 \ldots A_N$ represent constants that may or may not be of interest.

The system may also include light source 32, as shown in FIG. 1. Light source 32 may be a relatively high intensity light source such as a xenon flash tube. In addition, light source 32 may be a DC type light source, a pulsed light source, or an AC modulated light source. Light source 32 may be coupled by transmission medium 34 to a control system (not shown), which may be configured to control the light source according to the methods described herein. Light source 32 may be coupled to the charge deposition system such that an upper surface of a wafer can be illuminated during deposition of a charge on the wafer.

$V_{BB}$ can be determined using light source 32. For example, as described above, $V_s = V_{film} + V_{BB} + V_w + \phi$. Under intense light illumination, $V_{BB}$ can be substantially suppressed while other terms in $V_s$ remain substantially constant. Therefore, the method may include illuminating the upper surface of the insulating film during a measurement. $V_{BB}$ can be determined as approximately the difference between $V_s$ with the light off and $V_s$ with the light on, $V_{BB} \approx V_s(\text{light off}) - V_s(\text{light on})$. $V_{BB}$ can be measured in this manner using a DC type light source or a pulsed light source. Alternatively, $V_{BB}$ can be determined using an AC modulated light source by measuring the AC component of $V_s$ at the modulation frequency of the light source as described herein. This measurement sequence can also be repeated as described above to obtain $V_{BB}(V_0)$ for a range of $V_0$. In addition, this measurement can be performed at one or multiple measurement sites on the wafer.

One or more parameters representing electrical properties of the insulating film can be determined using any method known in the art and $I_{leak}(V_0)$, $Q_s(V_0)$, and/or $V_{BB}(V_0)$, which are determined from $V_s$ as described above. The parameters include, but are not limited to, electrical thickness, flatband voltage, interface trap density, hysteresis, charge, and threshold voltage. For example, capacitance of the film, $C_{film}$, may be determined using a least-squares fit of any portion of $Q_i$-$V_i$ data with a slope being equal to $C_{film}$. If the dielectric constant of the film is known or is assumed, an "electrical film thickness," $T_{film}$, may be determined from the capacitance. The capacitance of the film may be related to the electrical thickness using the equation:

$$T_{film} = \epsilon_0 * k * A / C_{film},$$

wherein $\epsilon_0$ is the free space permittivity of vacuum, and k is the film relative dielectric constant described above.

If $C_{film}$ is obtained from experimental data, and a theoretical model or a different experimental method has been used to obtain $T_{film}$, then these two parameters may be used to obtain the dielectric constant, k. For example, k may be obtained using a known relationship between dielectric constant, capacitance, and film thickness. An appropriate known relationship may include, but is not limited to, the expression for parallel plate capacitance:

$$k = \epsilon_0 A (C_{film} * T_{film}).$$

An appropriate known relationship between the dielectric constant, capacitance, and film thickness, however, may also include a parallel plate capacitor with fringing fields accounted for and an expression taking into account the detailed geometry of the insulating film. In this manner, a dielectric constant of an insulating film may be determined from a thickness and a capacitance that are independently determined. An independent determination of k may be a technologically important aspect for characterizing many dielectric materials.

If the insulating film is one of a plurality of insulating films or one of a plurality of insulating films and conductive films formed on a substrate, then the methods described herein may be used to determine a lump sum effective resistance and/or capacitance corresponding to the series resistance and/or capacitance, respectively, of the plurality of layers. If the capacitance or resistance of enough individual layers is known from one or more other techniques, then the unknown properties of a particular insulating film may be determined using a method as described herein and a model for series resistance and capacitance. The presence of a conductive layer formed on top of the insulating film is also not a hindrance to the methodology described herein as long as charge deposition is constrained to an area, A. Such a charge constraint may be achieved, for example, by a pattern formed on or in such an upper conductive layer.

In one embodiment, a parameter representing an electrical property of an insulating film determined from the surface voltage can be used for process control and monitoring. For example, a parameter of a process tool may be altered in response to the electrical property using a feedback control technique, a feedforward control technique, and/or an in-situ control technique. In an additional embodiment, $I(V_0)$ can be fitted into a dielectric leakage model to generate one or more parameters for on-line process control and monitoring. The dielectric leakage model may include any of the models described above. The process tool may include, but is not limited to, a chemical vapor deposition ("CVD") tool, a physical vapor deposition ("PVD") tool, an atomic layer deposition ("ALD") tool, and a thermal growth tool. In this manner, a parameter of a process tool may be altered for forming the insulating film on additional substrates. The process tool may also include a process tool used for further processing of the substrate on which the measured insulating film is formed. For example, the process tool may be a chemical-mechanical polishing ("CMP") tool. In this manner, a parameter of a process tool may be altered for further processing of the substrate on which the measured insulating film is formed. The parameter of the process tool may be altered manually or automatically. For example, a processor may be coupled to the process tool and may be configured to alter a parameter of the process tool in response to at least one of the electrical properties of the insulating film using a feedback control technique, a feedforward control technique, and/or an in situ control technique.

In another embodiment, the system may be integrated with semiconductor processing equipment such as one of the process tools described above as an in-situ monitoring instrument. In one example, the system and the process tool may be arranged as a cluster tool. In another example, the system may be coupled to a chamber of the process tool such as a load chamber or a cooling chamber. In further examples, the system and the process tool may be coupled by common elements such as a common power source, a common processor, a common stage, a common wafer handler, and a common environmental unit. In this manner, the method may be performed during a semiconductor fabrication process.

Each of the methods described herein may include loading a wafer underneath a charge deposition system either manually or automatically with, for example, a robot sample loading system. In one embodiment, $I_w$ may be measured while a control voltage is altered. Altering the control voltage during a measurement may be commonly referred to as "scanning" the control voltage or "sweeping" the control voltage. The control voltage may be either a reference voltage of the charge deposition system, $V_r$, or a reference voltage of the wafer, $V_w$, or a combination thereof. For example, $I_w$ may be measured while $V_r$ or $V_w$ is scanned across a range. The control voltage may be scanned by altering the control voltage continuously or intermittently. The scanning rate may be selected to optimize measurement results. $V_r$ or $V_w$ may be recorded while measuring $I_w$. Thus, the generated data may be $I_w$ vs. $V_r$ or $V_w$. $V_0$ corresponding to the $I_w$ measurements may be determined experimentally or using a function determined by calibration of the charge deposition system as described above. $V_{BB}$ may also be determined as described above. In addition, $I_{leak}(V_0)$, $Q_s(V_0)$, and parameters representing electrical properties of the insulating film may be determined as described above. The method can be performed at one or multiple measurement sites on the wafer.

In another embodiment, a control voltage may be altered to a set point. The control voltage may be either a reference voltage of the charge deposition system, $V_r$, a reference voltage of the wafer (the chuck voltage), $V_w$, or a combination thereof. After the control voltage is at the set point, $I_w$ vs. time may be recorded. The data collected is, therefore, $I_w(t)$ vs. $V_r$ or $V_w$, where t is the time after each $V_r$ or $V_w$ is set. The measurement may be performed in a single sweep thereby generating a single trace of $I_w$ vs. time. In addition, the measurement may be performed in a sweep over multiple set point changes. For example, in one embodiment, the set point may be altered multiple times, and $I_w$ vs. time may be recorded after each set point change. $I_w$ may also be measured over time until $I_w$ stabilizes to a substantially constant value. For example, $V_r$ or $V_w$ may be altered to a set point. After $V_r$ or $V_w$ is at the set point, $I_w$ may be measured over time until $I_w$ stabilizes to a constant value. This measurement may be repeated for each set point of $V_r$ or $V_w$. $V_0$ corresponding to the $I_w$ measurements may be determined experimentally or using a function determined by calibration of the charge deposition system as described above. $V_{BB}$ may also be determined as described above. In addition, $I_{leak}(V_0)$, $Q_s(V_0)$, and parameters representing electrical properties of the insulating film may be determined as described above. The method can also be performed at one or multiple measurement sites on the wafer.

The embodiments described herein may also be modified to increase measurement speed. For example, I may be measured while a control voltage is altered, or $I_w$ may be measured after a control voltage is at a set point as described above. During deposition of the charge and measurement of $I_w$, the upper surface of the insulating film may be illuminated with an AC modulated light source having a modulation frequency of $f_L$. Examples of appropriate modulation frequencies may range from about 10 Hz to about 10 MHz. The DC component of $I_w$, $I_{w\_DC}$, and the AC component of $I_w$ at frequency $f_L$, $I_{W\_AC}$, may be separately determined. Vs may be determined for both $I_{w\_DC}$ and $I_{w\_AC}$ either experimentally or using a function determined by calibration of the charge deposition system as described above. The DC component of $V_s$ is approximately equal to $V_0$. The amplitude of the AC component of $V_s$ at the modulation frequency of the light source is approximately equal to $V_{BB}$. The sign of $V_{BB}$ can be determined from the phase of the AC component. In this manner, $V_s$ and $V_{BB}$ can be determined from a single measurement thereby increasing the measurement speed.

In another embodiment, a wafer may be placed underneath a charge deposition system either manually or automatically using, for example, a robot sample loading system. A first $I_w$ may be measured during deposition of a first charge on a surface of the wafer. $I_w$ may be measured as described above. $V_s$ and $V_0$ may be determined either experimentally or using a function determined by calibration of the charge deposition system as described above. In one embodiment, during measurement of $I_w$, a control voltage, $V_r$ or $V_w$, may be scanned over a range. The range may be predetermined by an operator. In another embodiment, the $I_w$ vs. $V_r$ or $V_w$ data may be used to determine a current turn-on point. A current-turn on point corresponds to a point in a plot of $I_w$ vs. $V_r$ or $V_w$ data at which a discontinuity in the slope of the plot occurs. $V_s$ and $V_0$ may be determined from $I_w$ at the current turn-on point either experimentally or using a function determined by calibration of the charge deposition system as described above. $V_{BB}$ may also be determined by illuminating the wafer during the measurement as described above. For example, $V_{BB}$ may be obtained by illuminating the wafer with a DC modulated light source or a pulsed light source and comparing $V_0$(light on) and $V_0$(light off). Alternatively, $V_{BB}$ can be determined by illuminating the wafer with an AC modulated light source and measuring the AC component in $V_0$ at the modulation frequency.

After obtaining the $I_w$ vs. $V_r$ or $V_w$ data, an additional charge may be deposited on the wafer. The additional charge may be deposited at approximately the location on the insulating film at which $I_w$ was previously measured. The additional charge may be deposited in a high current mode. For example, $V_r$ or $V_w$ may be altered such that a relatively large amount of charge is deposited on the surface of the wafer within a relatively short amount of time. The initial charge and the additional charge may be deposited with the same charge deposition system or different charge deposition systems. The total amount of charge (Q) deposited on the insulating film may be measured. After this charge deposition, $I_w$ may be measured as described above. If different charge deposition systems are used to deposit the initial and additional charges on the wafer, $I_w$ may be measured with the charge deposition system that was used to deposit the initial charge on the wafer or the charge deposition system that was used to deposit the additional charge on the wafer. The method can be performed at one or multiple measurement sites on the wafer.

$V_s$ and $V_0$ of the insulating film may be determined from the measured current as described above. In this manner, $V_s$ and $V_0$ of the insulating film may be determined at approximately the same location on the insulating film before and after the high current mode deposition. In one embodiment, the control voltage may be scanned after the additional charge deposition, and $I_w$ may be measured as described above. The additional charge deposition and subsequent $I_w$ measurement may be repeated until a complete Q-V sweep is measured. For example, a complete sweep may include sweeping voltages from inversion to accumulation (positive to negative on a p-type wafer or negative to positive on an n-type wafer). The measurements of $I_w$ after each step of driving the wafer to accumulation and toward inversion may be used to determine $V_s$ and/or $V_0$, which may be used to generate Q-V sweep data. The flatband voltage and the interface trap density may be determined from the generated Q-V sweep.

Figure 4:
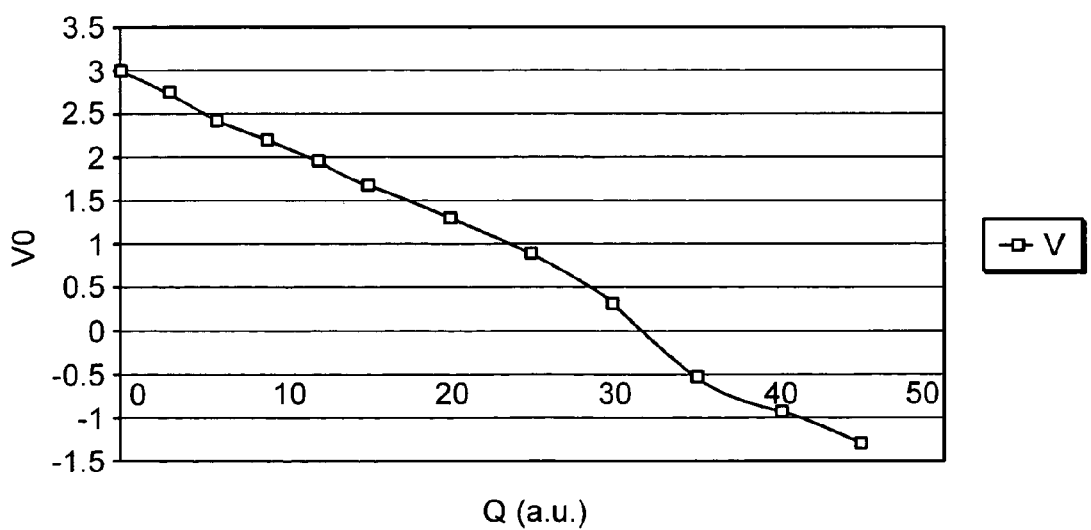
FIG. 4 is a plot of one example of representative voltage vs. charge data that may be obtained by using one charge deposition system to deposit a charge and another charge deposition system to measure current to wafer.

$V_0$ and $V_{BB}$ may also be determined as described above. In this manner, $V_0$ and $V_{BB}$ VS. Q data may be obtained, where Q is the charge deposited on the wafer surface. One example of representative $V_0$ vs. Q data that may be obtained by using one charge deposition system to deposit the additional charge and another charge deposition system to measure $I_w$ is illustrated in the plot of FIG. 4. This plot is representative of data that may be obtained for a wafer that includes an $SiO_2$ film deposited on a silicon substrate. The deviation of $V_0$ from linear dependence on Q at values of Q from approximately 30 to approximately 40 is due to $V_{BB}$. Furthermore, parameters representing electrical parameters of the insulating film may also be determined from measured $V_0(Q)$ and $V_{BB}(Q)$ data as described above.

In an additional embodiment, the charge deposition system can be operated at substantially constant $I_w$ by altering a control voltage such as $V_r$, $V_w$, or $V_r$ and $V_w$. For example, $V_r$ or $V_w$ may be altered by a servo control circuit. This method may be used to determine charge vs. voltage data for an insulating film. The method may be performed by loading a wafer underneath a charge deposition system as described above. The charge deposition system may be turned on to deposit a charge on an upper surface of the insulating film. The charge may be deposited in a substantially constant $I_w$ mode over time by servo controlling $V_r$ or $V_w$ or a combination of both. The control voltage signal is recorded as function of time. From the recorded control voltage vs. time data, $V_s$ and/or $V_0$ may be determined as a function of the charge deposited on the insulating film, Q. $V_0$ may be determined from the control voltage and the current. The charge deposited may be determined from the equation: $Q=I_w*t$. The method may also optionally include determining $V_{BB}$ as a function of the charge deposited, Q, based on one of the methods described above. For example, $V_{BB}$ may be determined by illuminating the wafer with a DC type light source, a pulsed light source, or an AC modulated light source during measurement. In addition, parameters representing electrical properties of the insulating film may be determined from measured $V_0(Q)$ and $V_{BB}(Q)$ data as described above. This method can also be performed at one or multiple measurement sites on the wafer.

Figure 5:
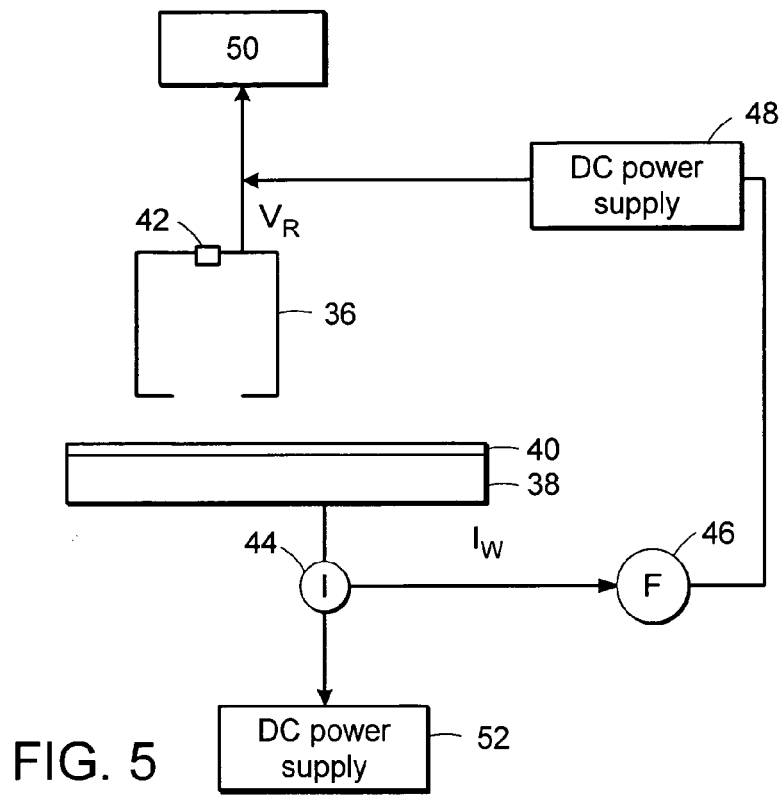
FIGS. 5 and 6 illustrate schematic diagrams of different embodiments of a system that includes a servo control circuit, which may be used to alter a control voltage.
Figure 6:
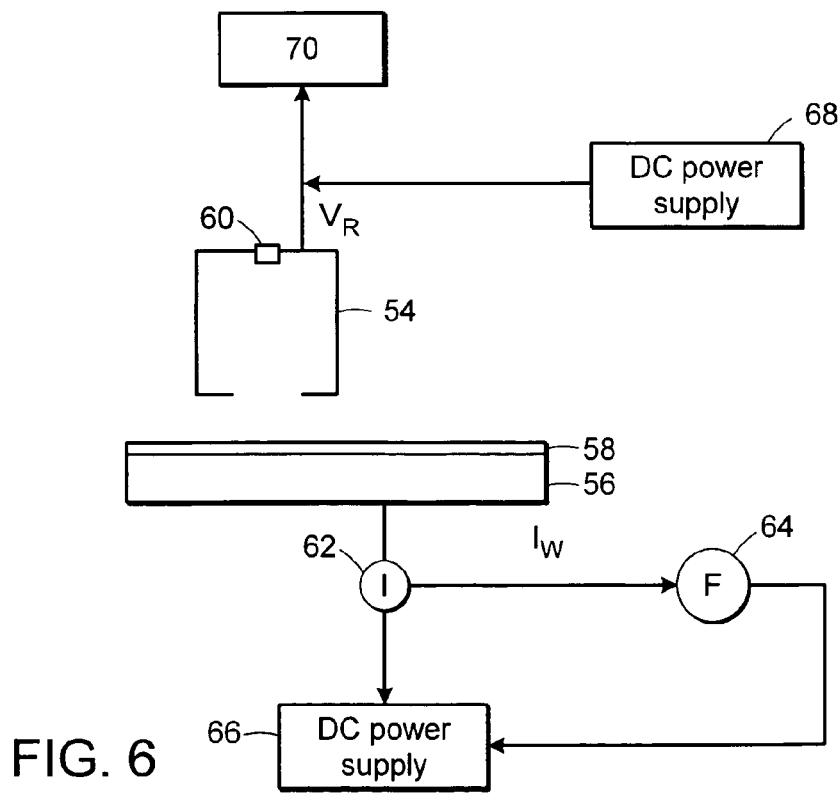

FIGS. 5 and 6 illustrate schematic diagrams of different embodiments of a system that includes a servo control circuit, which may be used to alter $V_r$ or $V_w$. As shown in FIG. 5, the system includes charge deposition system 36 disposed above chuck 38. Charge deposition system 36 and chuck 38 may be configured as described above. Wafer 40 may be disposed upon chuck 38. Charge deposition system 36 may also include light source 42. Light source 42 may be used to illuminate the wafer such that $V_{BB}$ can be determined as described above. The system also includes current meter 44 configured to measure $I_w$. The $I_w$ signal generated by current meter 44 is provided to servo control circuit 46. Servo control circuit 46 is configured to generate a control signal depending upon the $I_w$ signal generated by current meter 44. Servo control circuit 46 provides the control signal to DC power supply 48. DC power supply 48 alters the reference voltage $V_r$ of the charge deposition system depending upon the control signal. In this manner, $V_r$ may be altered such that a charge may be deposited upon wafer 40 at a substantially constant $I_w$. Data recorder 50 records values of $V_r$ over time. The system may also include DC power supply 52 configured to alter a reference voltage of the wafer, $V_w$.

As shown in FIG. 6, the system includes charge deposition system 54 disposed above chuck 56. Charge deposition system 54 and chuck 56 may be configured as described above. Wafer 58 may be disposed upon chuck 56. Charge deposition system 54 may also include light source 60. Light source 60 may be used to illuminate the wafer such that $V_{BB}$ can be determined as described above. The system also includes current meter 62 configured to measure $I_w$. The $I_w$ signal generated by current meter 62 is provided to servo control circuit 64. Servo control circuit 64 is configured to generate a control signal depending upon the $I_w$ signal generated by current meter 62. Servo control circuit 64 provides the control signal to DC power supply 66. DC power supply 66 alters the reference voltage of the wafer, $V_w$, depending upon the control signal. In this manner, $V_w$ may be altered such that a charge may be deposited upon wafer 58 at a substantially constant $I_w$. The system may also include DC power supply 68 configured to alter a reference voltage of the charge deposition system, $V_r$. Data recorder 70 records values of $V_r$ over time. The system may also include another data recorder (not shown) configured to record values of $V_w$ over time. In another embodiment, a system may include both of the servo control circuits illustrated in FIGS. 5 and 6. In this manner, both $V_r$ and $V_w$ may be altered over time such that the charge deposition system may be operated in a substantially constant current to wafer mode. The systems shown in FIGS. 5 and 6 may be further configured as described above and may include elements of the system shown in FIG. 1.

Further modifications and alternative embodiments of various aspects of the invention may be apparent to those skilled in the art in view of this description. For example, methods for determining a parameter representing an electrical property of an insulating film are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for determining a surface voltage of an insulating film, wherein a wafer comprises the insulating film formed on a substrate, the method comprising:
   depositing a charge on an upper surface of the insulating film;
   measuring a current to the wafer during said depositing;
   detecting the charge on a reference sensor during said depositing and measuring a bias voltage of the reference sensor; and
   determining the surface voltage of the insulating film from the current, wherein the surface voltage is approximately equal to the bias voltage of the reference sensor when the current to the reference sensor is approximately equal to the current to the wafer.

2. The method of claim 1, wherein said determining comprises determining an accumulated voltage as a function of the current, wherein the function is determined by calibration of a charge deposition system used for said depositing, and determining the surface voltage from the accumulated voltage and a reference voltage of said depositing.

3. The method of claim 1, wherein said depositing comprises depositing the charge until the current to the wafer is substantially constant, wherein the substantially constant current is approximately equal to a leakage current of the insulating film.

4. The method of claim 1, wherein said depositing comprises depositing the charge over time, the method further comprising determining charge build up on the upper surface by integrating the current over the time.

5. The method of claim 1, further comprising illuminating the upper surface of the insulating film during said measuring, and determining a band-bending voltage at an interface between the insulating film and the substrate as a difference between the surface voltage and a surface voltage of the insulating film determined without said illuminating.

6. The method of claim 1, further comprising illuminating the upper surface of the insulating film with an alternating current modulated light source during said depositing and said measuring, and determining a direct current component and an alternating current component of the current at the frequency of the light source, wherein said determining comprises determining the surface voltage for the direct current and alternating current components of the current.

7. The method of claim 1, further comprising altering a control voltage after said measuring and repeating said depositing, said measuring, and said determining.

8. The method of claim 1, wherein said depositing comprises exposing the wafer to a plasma.

9. The method of claim 1, further comprising determining a parameter representing an electrical property of the insulating film from the surface voltage.

10. The method of claim 1, further comprising determining a parameter representing an electrical property of the insulating film from the surface voltage and altering a parameter of a process tool in response to the electrical property using a feedback control technique.

11. The method of claim 1, further comprising determining a parameter representing an electrical property of the insulating film from the surface voltage and altering a parameter of a process tool in response to the electrical property using a feedforward control technique.

12. The method of claim 1, further comprising performing the method during a semiconductor fabrication process.

13. A method, comprising:
   measuring a first current to a wafer during deposition of a first charge on a surface of the wafer, wherein said measuring the first current comprises measuring the first current while altering a control voltage, and wherein the wafer comprises an insulating film formed on a substrate;
   determining a first surface voltage of the insulating film from the first current, wherein said from the first surface voltage comprises determining a current turn-on point from the first current vs. the control voltage and determining the first surface voltage
   measuring a second current to the wafer after a high current mode deposition of a second charge on the surface of the wafer; and
   determining a second surface voltage of the insulating film from the second current, wherein the first and second surface voltages are determined at approximately the same location on the insulating film.

14. The method of claim 13, further comprising repeating said measuring the second current and said determining the second surface voltage until a Q-V sweep is measured.

15. The method of claim 13, wherein the first charge and the second charge are deposited with the same charge deposition system.

16. The method of claim 13, wherein the first charge and the second charge are deposited with different charge deposition systems.

17. A method for determining charge vs. voltage data for an insulating film, wherein a wafer comprises the insulating film formed on a substrate, the method comprising:
   depositing a charge on an upper surface of the insulating film;
   altering a control voltage during said depositing such that a current to the wafer is substantially constant over time, wherein the substantially constant current is approximately equal to a leakage current of the insulating film; and
   determining a voltage of the insulating film as a function of the charge deposited on the insulating film, wherein the voltage is determined from the control voltage and the current, and wherein the charge deposited on the insulating film is determined from the current and the time.

18. The method of claim 17, wherein the control voltage is a reference voltage of the charge deposition system or a reference voltage of the wafer.

* * * * *